United States Patent
Natarajan et al.

(12)

(10) Patent No.: US 6,607,780 B1
(45) Date of Patent: Aug. 19, 2003

(54) PROCESS OF FORMING A CERAMIC STRUCTURE USING A SUPPORT SHEET

(75) Inventors: Govindarajan Natarajan, Pleasant Valley, NY (US); John U. Knickerbocker, Hopewell Junction, NY (US); Robert W. Pasco, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/578,580

(22) Filed: May 25, 2000

(51) Int. Cl.$^7$ .............. B05D 5/12; H05K 3/36; C03B 29/00

(52) U.S. Cl. ............. 427/97; 156/253; 156/89.12; 29/830

(58) Field of Search ................ 156/252, 253, 156/89.11, 89.12, 289; 427/96, 97; 29/830; 430/311

(56) References Cited

U.S. PATENT DOCUMENTS

| | | | | |
|---|---|---|---|---|
| 5,176,772 A | | 1/1993 | Ohtaki | 156/89 |
| 5,300,163 A | | 4/1994 | Ohtaki | 156/89 |
| 5,368,667 A | | 11/1994 | Minh et al. | 156/89 |
| 5,466,330 A | * | 11/1995 | Sakai et al. | 156/584 |
| 5,480,503 A | | 1/1996 | Casey et al. | 156/89 |
| 5,681,444 A | * | 10/1997 | Azzaro et al. | 205/125 |
| 5,759,669 A | | 6/1998 | Casey et al. | 428/139 |
| 5,779,833 A | | 7/1998 | Cawley et al. | 156/89.11 |
| 5,849,396 A | | 12/1998 | Ali et al. | 428/209 |
| 5,949,030 A | * | 9/1999 | Fasano et al. | 174/262 |
| 5,976,286 A | * | 11/1999 | Natarajan et al. | 156/60 |
| 6,072,690 A | * | 6/2000 | Farooq et al. | 361/321.2 |
| 6,245,171 B1 | * | 7/2001 | Natarajan et al. | 156/89.11 |
| 6,286,204 B1 | * | 9/2001 | Sreeram et al. | 29/825 |

* cited by examiner

*Primary Examiner*—Brian K. Talbot
(74) *Attorney, Agent, or Firm*—Margaret A. Pepper

(57) ABSTRACT

The present invention relates generally to a new ceramic structure and process thereof. Basically, the present invention relates to a structure and method for forming laminated structures and more particularly to a structure and method for fabricating multi-layer ceramic products using very thin green sheets and/or green sheets with very dense electrically conductive patterns on top of a stronger support sheet. The structure and method of the present invention enables the screening, stacking and handling of very thin green sheets and/or green sheets with very dense metallized patterns in the manufacture of multi-layer ceramic packages. The thin green sheets were tacked/bonded to thicker and stronger support sheets to form a sub-structure which had excellent stability in screening and enabled further processing. The sheets are anchored or pinned in such a way as to allow the processing of the green sheet with the subsequent easy removal of the support sheet.

33 Claims, 2 Drawing Sheets

PROCESS OF FORMING A CERAMIC STRUCTURE USING A SUPPORT SHEET

FIELD OF THE INVENTION

The present invention relates generally to a new ceramic structure and process thereof. Basically, the present invention relates to a structure and method for forming laminated structures and more particularly to a structure and method for fabricating multi-layer ceramic products using very thin green sheets and/or green sheets with very dense electrically conductive patterns on top of a stronger support sheet.

BACKGROUND OF THE INVENTION

Multi-layer ceramic (MLC) structures are used in the production of electronic substrates and devices. The MLCs can have various layering configurations. For example, a MLC circuit substrate may comprise patterned metal layers which act as electrical conductors sandwiched in between ceramic layers which act as a dielectric medium. For the purposes of interlayer interconnections, most of the ceramic layers have tiny holes or via holes. Prior to lamination, the via holes are filled with an electrically conductive paste, such as, a metallic paste, and sintered to form vias which provide the electrical connection between the layers. In addition, the MLC substrates may have termination pads for attaching semiconductor chips, connector leads, capacitors, resistors, to name a few.

Generally, conventional ceramic structures are formed from ceramic green sheets which are prepared from a slurry of ceramic particulate, thermoplastic polymer binders, plasticizers, and solvents. This composition is spread or cast into ceramic sheets or slips from which the solvents are subsequently volatilized to provide coherent and self-supporting flexible green sheets. After punching, metal paste screening, stacking and laminating, the green sheets are fired or sintered at temperatures sufficient to burn-off or remove the unwanted polymeric binder resin and sinter the ceramic particulate together into a densified ceramic substrate. The present invention is directed to the screening, stacking and lamination steps of this process.

In the MLC packaging industry it is very common to use green sheets of various thicknesses. The thicknesses can typically vary from 6 mils to 30 mils and in general the art of punching and metallizing these layers are well known. Green sheet thicknesses below 6 mils, in general, are very scarcely used. This is due to a variety of reasons, such as, for example, handling, screening and stacking of green sheets thinner than 6 mils pose tremendous challenges. In fact the use of one to two mils thick ceramic green sheets, which are punched and screened, using traditional MLC technology does not exist in the prior art.

Also, in the MLC packaging industry it is very common to use capacitor layers. The capacitance necessary in a package depends on the design and such capacitance is obtained by choosing proper dielectric layer thickness and metal area within a layer. The industry is always striving for higher capacitance and since the metal area is maxing out for a given substrate size it is necessary to use thinner dielectric layers between electrodes to obtain the required capacitance. For example, as a rule of thumb one could double the capacitance for a given dielectric system and electrode metal area by decreasing the dielectric layer thickness by half. Additionally the number of layers needed for capacitance in a package as well has been reduced by about 50 percent. The reduction in the number of layers is desirable, as it reduces the cost and the process of making the substrate.

The term thin sheet or layer as used herein means that the thickness of the sheet can be anywhere from about 0.5 mil to about 6.0 mils. Production level screening and stacking of thin sheets is not possible with the current technology as the thin sheets tend to shrink a lot and they also tend to distort during the process.

U.S. Pat. No. 5,176,772 (Ohtaki) and U.S. Pat. No. 5,300,163 (Ohtaki), addresses a method of forming a thin sintered ceramic board by laminating punched and screened green tapes on a presintered ceramic body and sintering the assembly to obtain a flat board. This method essentially enables one to obtain a flat laminate. But, with ceramic substrates with materials like alumina and aluminum nitride there is typically a 14 to 20 percent X-Y shrinkage. So there will be delamination and distortion involved in sintering due to presintered base. Furthermore, one needs to handle these sheets through screening in free standing state.

U.S. Pat. No. 5,368,667 (Minh), teaches preparing a multi-layer capacitor which is one to two mils thick by extruding a thick dielectric layer and a metal containing layer through a roll laminator. This approach is good for using a thin layer having the blanket metallurgy. But in almost all multi-layer ceramic packages, one needs to have vias for electrical connectivity. However, this patent does not address the problem of handling the thin sheets in via filling and stacking.

U.S. Pat. No. 5,480,503 (Casey), teaches releasably-supporting the thin green sheets on a temporary carrier support having an ablatable release layer over a patterned conductive layer, and filling the vias with conductive metal paste, whereby the thin green sheets are supported against warpage and distortion. The supported green sheets are formed as single layers, pairs and stacks thereof, and separated from temporary support for use. The suggested temporary support is a glass plate. The metallization technique is CVD type plating and in the process has to use non-ablatable and ablatable films on the green sheet. These films inherently will distort the green sheet during temperature and pressure processing. Furthermore, the non-ablatable film stays with every single green sheet layer and will create delamination and density difference in sintering.

U.S. Pat. No. 5,976,286 (Natarajan), assigned to International Business Machines Corporation, Armonk, N.Y., USA, the disclosure of which is incorporated herein by reference, teaches the use of at least one thin green sheet and a thick green sheet for fabricating a multi-density sub-structure.

The structure and method of the present invention enables the screening, stacking and handling of very thin green sheets and/or green sheets with very dense metallized patterns in the manufacture of multi-layer ceramic packages. With the preferred embodiment, thin green sheets were tacked and bonded to a support sheet, such as, a thin metal or a like carrier, to form a sub-structure which yields excellent stability in screening and enables excellent handling and alignment in stacking. The green sheet may have electrically conductive features within them, such as, a via, or over them, such as, a line, cap, to name a few.

PURPOSES AND SUMMARY OF THE INVENTION

Bearing in mind the problems and deficiencies of the prior art it is therefore one purpose of the present invention to provide a novel method and structure for producing metallized thin green sheets including sub-structures in multi-layer ceramic packages as capacitor layers or with fine line patterned conductive metal layers.

Another purpose of this invention is to provide a structure and a method that will ensure multiple thin layers in a multilayer ceramic package.

Still another purpose of the present invention is to provide a structure and method that will ensure higher capacitance in a multi-layer ceramic package.

Yet another purpose of the present invention is to have a structure and a method for fine line pattern using thin green sheets in multi-layer ceramic packages.

Still yet another purpose of the present invention is to provide a structure and a method for metallizing a thin green sheet without any detrimental distortion.

Still another purpose of the present invention is to have a structure and a method that will ensure handling of thin green sheets for multi-layer ceramic packages.

It is another purpose of the invention to have a structure and a method that produces a multilayer ceramic package that is predictable and repeatable.

Another purpose of the present invention is to laminate several stacked green sheets to produce sub-structures.

Other purposes, objects and advantages of the present invention will in part be obvious and will in part be apparent from the specification.

Therefore, in one aspect this invention comprises a method for fabricating a ceramic substrate comprising the steps of:
 (a) applying at least one thin photosensitive polymer layer over a support sheet,
 (b) forming at least one opening in said thin photosensitive polymer layer and said support sheet,
 (c) filling said at least one opening with at least one electrically non-conductive paste,
 (d) placing at least one green sheet over said at least one photosensitive polymer layer and said paste,
 (e) opening at least one through-hole through said green sheet, such that at least a portion of said electrically non-conductive paste remains adhered to at least a portion of the side-wall,
 (f) filling said opening with at least one electrically conductive paste, and thereby fabricating said ceramic substrate.

In another aspect this invention comprises a ceramic substrate comprising at least one green sheet with at least one via hole having at least one electrically conductive material in intimate contact with at least one carrier support sheet, and wherein said carrier support sheet has at least one via opening which is filled with an electrically conductive material and an electrically non-conductive material and wherein at least a portion of said at least one electrically conductive material is surrounded by at least a portion of at least one electrically non-conductive material, and thereby forming said ceramic substrate.

In yet another aspect this invention comprises a ceramic substrate comprising at least one green sheet with at least one via hole having at least one electrically conductive material in intimate contact with at least one metal carrier support sheet, and wherein said metal carrier support sheet has at least one via opening which is filled with an electrically conductive material and an electrically non-conductive material and wherein at least a portion of said at least one electrically conductive material is surrounded by at least a portion of at least one electrically non-conductive material, and thereby forming said ceramic substrate.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The structure and method of the present invention enables the handling, screening and stacking of thin ceramic layers. These thin ceramic layers are used in the semiconductor industry for a variety of purposes, such as, for example, for a capacitor structure, or for a fine line pattern structure in MLC packages, to name a few. Basically, the invention is a novel structure and method where a support sheet, such as, a thick or a thin metal sheet, is used as a base or a support for a thinner ceramic green sheet layer. Additionally, the support sheet or the base acts as a shrinkage and distortion restrainer when the thinner ceramic sheet is screened with conductive paste and dried. Furthermore, the thinner green sheet on the thin support base totally eliminates handling problems, such as, for example, in stacking.

Figure 1:
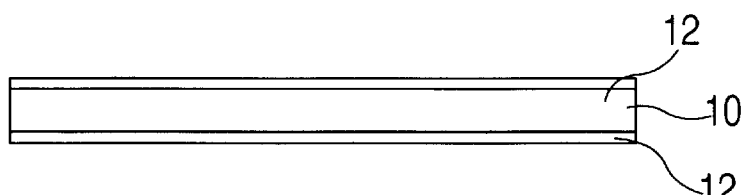
FIG. 1, illustrates a thin photosensitive polymer layer over a thin support sheet.

FIG. 1, illustrates at least one thin photosensitive polymer layer 12, over a support sheet 10. The photosensitive polymer layer 12, can be on one side or both sides of the support sheet 10. The support sheet 10, can be a thin metal sheet or a polymer/plastic sheet 10. It is preferred that the metal sheet 10, be selected from a group comprising stainless steel, nickel, aluminum, molybdenum, permalloy (alloy of Ni and Mo), to name a few. It is preferred that the support sheet 10, be selected from a group comprising polymer, plastic, polyester, PEN (Polyethylene Naphthalate), to name a few. However, for the support sheet 10, one could even use paper, such as, a coated or uncoated paper, for example, wax paper, silicone or acrylic coated paper, to name a few.

Figure 2:
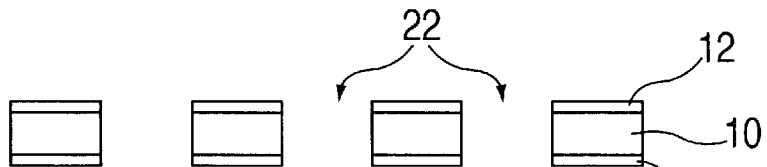
FIG. 2, illustrates openings in the structure of FIG. 1.

For the preferred embodiment one would use a cold rolled thin metal sheet 10, as shown in FIG. 1, and form openings 22, through the photosensitive polymer 12, as illustrated in FIG. 2.

Using conventional photo-processing techniques one would then form at least one through-hole 22, in the thin metal sheet 10, as shown in FIG. 2. The holes or openings 22, are on a grid, i.e., essentially the thin metal sheet 10, will have holes 22, for every via that is going to be formed in every layer of the MLC structure of this invention.

Figure 3:
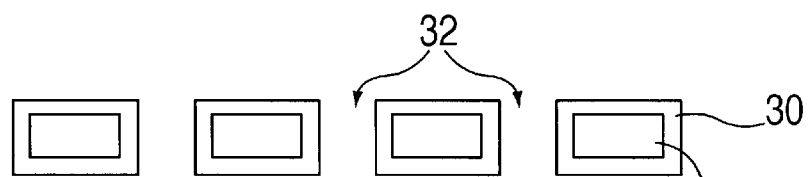
FIG. 3, illustrates an optional step of adhering a layer in the open areas.

FIG. 3, also illustrates an optional step of adhering a layer 30, in the open areas of the thin metallic sheet 10. The metal sheet 10, can be treated with the layer 30, so that structure could have a firmer or better bond with a green sheet. The treatment can be a chemical or a mechanical process. A chemical process could include oxidation of the surface, whereas a mechanical process could include spraying, coating, etc. of an adhesive onto the surface. It should be noted that the treatment could be on one or more selected surfaces, and does not have to be on all the exposed surfaces. Through-hole 32, in FIG. 3, is the same as hole 22, except that it has the optional treatment 30.

Figure 4:
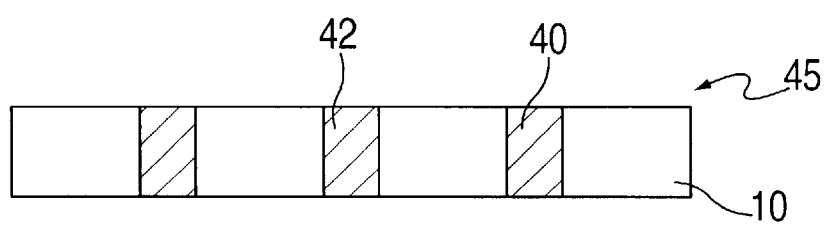
FIG. 4, illustrates the insertion of paste in the openings.

FIG. 4, illustrates the insertion of at least one paste 40, in the opening 32, to form a personalized carrier 45. The bonding paste 40, could be screened or extruded into the hole 32, in the thin metal sheet 10. The bonding paste 40, can be a fugitive paste (i.e. that it contains only organic materials) or a paste 40, that contains dielectric inorganic or conductive polymers. The basic purpose of the paste 40, includes bonding of the thin metal sheet 10, to a green sheet 50, in areas where vias in the green sheet 50, may be formed, as more clearly illustrated in FIG. 5.

Figure 5:
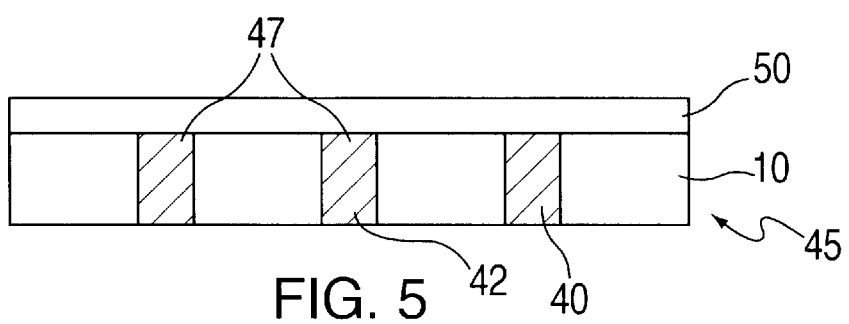
FIG. 5, illustrates the adhering of a green sheet over the structure shown in FIG. 4.

As shown in FIG. 5, the sub-lamination of the green sheet 50, to the personalized carrier 45, minimizes the radial movement of a via in green sheets 50, when the green sheets 50, are subsequently personalized. This is due to the fact that the bonding paste 40, in the vias 42, gets anchored or pinned to the green sheet 50, and this anchoring or pinning substantially reduces and/or eliminates any radial movement between the green sheet 50, and the support sheet 10. The green sheet 50, can be of any thickness, however, it is preferred that the green sheet 50, be less than 6 mils, as that would define the green sheet 50, to be a thin sheet.

The term thin green sheet as used herein is a relative measure and it means as thin as one could preform to as thin as one could handle through via forming technique like mechanical punching or laser hole formation or very intensive chemical technique such as photo-processing.

The bonding and/or tacking of the thinner green sheet 50, to the carrier 45, can be achieved by a variety of processes, such as, for example, a lamination or sublamination process.

The sub-lamination process is a very low pressure lamination, typically less than about 1000 psi, at temperatures of less than about 90° C., for a time period of less than about 5 minutes. The sub-lamination process besides bonding the carrier 45, to a green sheet 50, also provides a very flat and smooth surface which is very helpful for the subsequent operations.

Figure 6:
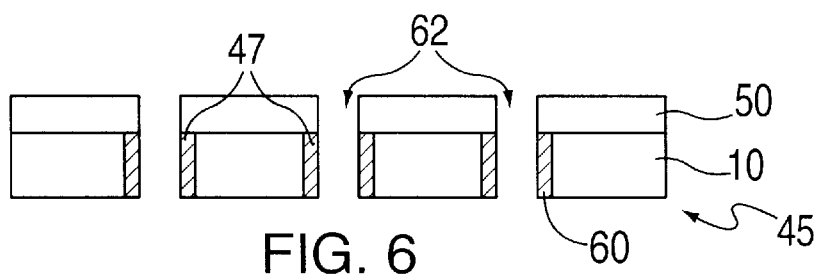
FIG. 6, illustrates the formation of openings in the structure shown in FIG. 5.

FIG. 6, illustrates the formation of via openings 62, in the structure shown in FIG. 5. The hole 32, in the metal support sheet 10, may be slightly larger in diameter than the via holes 62, in the green sheet 50. Since there are several thousand vias 62, in a given MLC, the bonding or location pinning of vias 62, are very effective for stability control.

The via openings 62, could be formed by methods well known in the art, such as, punching (mechanical, laser, etc.) or maybe by forming via openings in the green sheet 50, if the green sheet 50, is thick enough to handle via openings without having any degrading effect. Even though the metal support sheet 10, has vias on all grids, the required vias 62, in the green sheet 50, are opened using the corresponding metal via 42, as a guide. The via opening 62, in the green sheet 50, are smaller compared to the via 42, which now has been filled with bonding paste 60, in the side-walls in the thin metal support sheet 10. Thus the via positional integrity and the bonding of the green sheet 50, to the metal carrier 10, are maintained.

Figure 7:
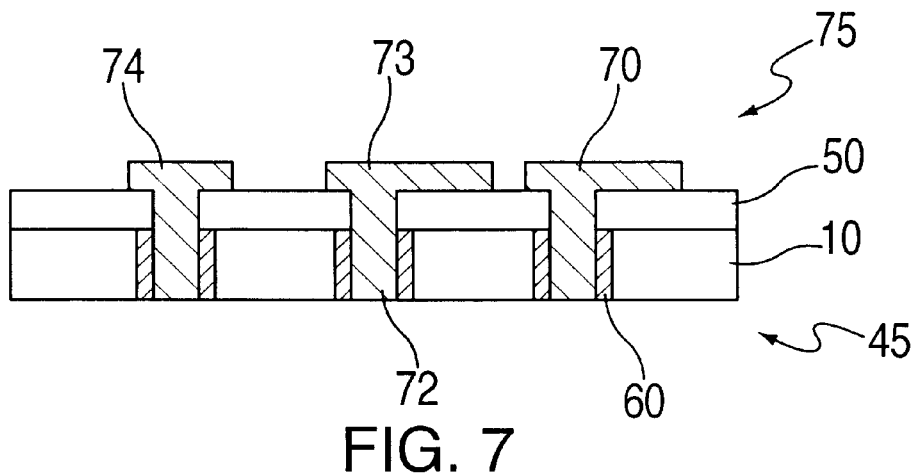
FIG. 7, illustrates the filling of the openings in the structure of FIG. 6.

FIG. 7, illustrates the filling of the openings 62, in the structure of FIG. 6, using at least one metal paste 70, to form an inventive structure 75, of this invention. The metal paste 70, would be used to fill at least one via 72. It is preferred that the via 72, is filled from the side of the green sheet 50, and not from the side of the metal 10. Typically, an electrically conductive paste 70, would be screened into the via hole 62, and the green sheet 50, would be metallized with an appropriate pattern 73 and 74. The patterns 73 and 74, could be an electrically conductive line 73, or a cap 74, thus personalizing the green sheet 50.

Figure 8:
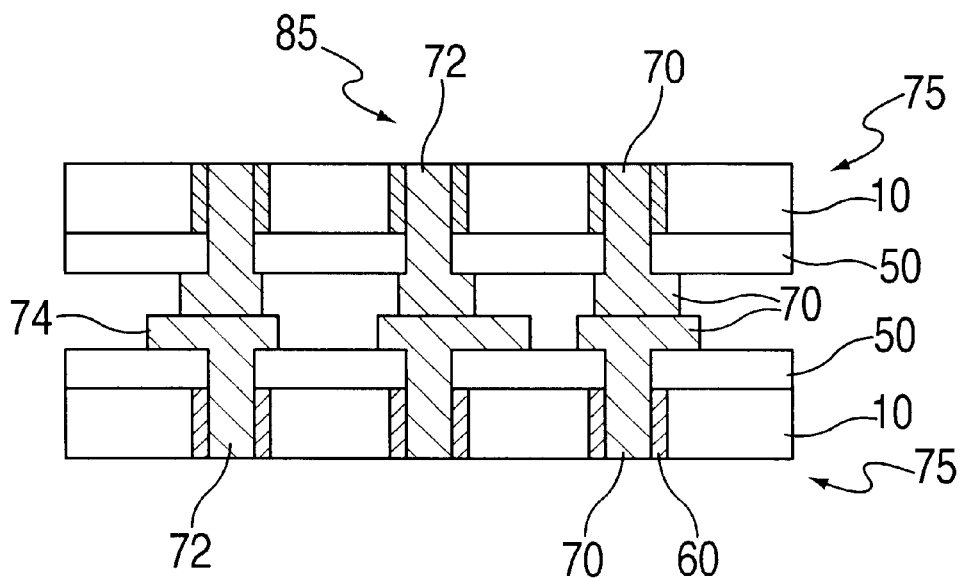
FIG. 8, illustrates the joining of two structures of FIG. 7.

FIG. 8, illustrates the joining of two structures 75, of FIG. 7, to form a multi-layer ceramic (MLC) structure 85. However, several layers of structure 75, can be bonded thus to form the MLC structure 85.

It is very important that the bonding and/or tacking process used to form the MLC structure 85, should not distort the features 73 and 74, located on the green sheets 50. A lamination pressure of less than 800 psi and a temperature of less than 90° C. was found suitable for the bonding and/or tacking operation.

After the bonding/tacking process a multi-media or multi-density sub-structure 85, was obtained, which comprises of at least two ceramic layers 50, with at least two carriers 45. The structure 75, looks and behaves as a single green sheet layer 50. The sub-structure 75, has via hole 72. Furthermore, the metallized vias 72, are very well aligned with the via 73, and via 74, and thus enable top to bottom alignment when stacked. These unique features of this invention enable the handling of the thin ceramic sheet 10, as a sub-structure 75.

Many sub-structures 75, can be built with as many thin green sheets 50, as necessary to build a final MLC laminate 85 or 95. As one can clearly see in FIG. 7, that the sub-structure 75, has one thin green sheet 50, and this structure 75, has the rigidity for handling through screening and stacking. Furthermore, the dimensional stability of the screened features in thin sheets 50, would be far better when screened as a sub-structure compared to screened as a free standing thin sheet 50.

Figure 9:
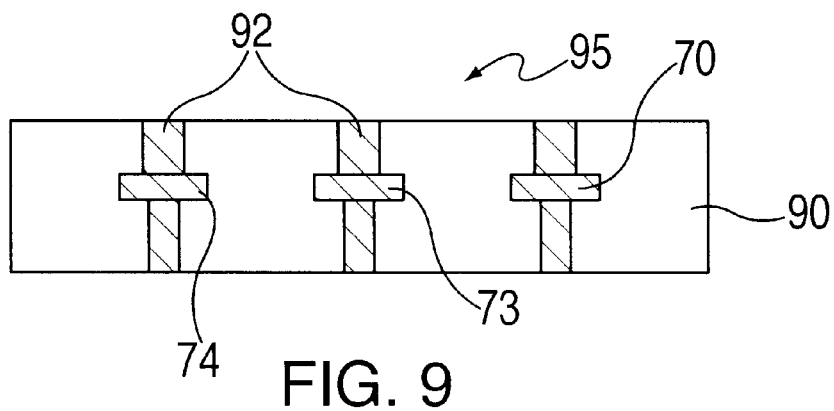
FIG. 9, illustrates the joined structures of FIG. 8, after the removal of the thin support sheet.

FIG. 9, illustrates the joined structures of FIG. 8, after the removal of the metallic supports. Basically, the MLC structure 85, is stacked and the carrier sheet 45, is separated. For most applications the carrier sheet 45, can be removed by a simple X-Y twist and/or peeling. This results in a MLC substrate 95, having a green sheet 90, with embedded vias 92, via lines 73, and via caps 74.

As shown in FIG. 9, the multi-layer multi-density ceramic package 95, could be formed by combining, for example, two sub-structures 75, resulting in the ceramic package 85, comprising of at least one thick ceramic layer 50, and at least one thin or thick ceramic layer 50. The two sub-structures 75, could then be tacked/bonded to each other and processed to form the ceramic package 95.

The green sheet could have one or more electrically conductive features, such as, for example, cap, line, via, to name a few. These features could be made from at least one electrically conductive material.

The electrically conductive material used with this invention is preferably selected from a group comprising copper, molybdenum, nickel, tungsten, metal with glass frit, metal with glass grit, to name a few.

The material for the ceramic green sheet is preferably selected from a group comprising alumina, alumina with glass frit, borosilicate glass, aluminum nitride, glass ceramic, to name a few.

The tacking and/or bonding could be done in a chemical environment, and wherein the chemical is preferably selected from a group comprising water, methanol, methyl-iso-butyl ketone, isopropyl alcohol, alumina, aluminum nitride, borosilicate, glass ceramic, copper, molybdenum, tungsten, nickel, to name a few.

Another advantage of this invention is the ability to punch, screen and stack very dense via and pattern in a package. As the via and pattern metal density increases in a green sheet (thick or thin) the feature radial error increases as well when one handles the green sheets as a free standing body. In such instances one could use the same or similar process as described and illustrated in FIGS. 1 through 7. Basically, the dense patterns are screened on the ceramic sub-structures rather than on the free standing ceramic green sheets. It has been found that the shrinkage and distortion is far smaller when sub-structures are screened than when the free standing green sheets are similarly processed. Furthermore, the sub-structures are built using the normal green sheet materials and the existing electrically conductive metal/composite pastes.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for fabricating a ceramic substrate comprising the steps of:
   (a) forming at least one opening in a support sheet using a photolithography technique,
   (b) filling said at least one opening with at least one non-conductive paste,
   (c) placing at least one green sheet on said support sheet and said non-conductive paste, wherein at least a portion of said non-conductive paste in said support sheet is anchored to at least a portion of said green sheet,
   (d) opening at least one through-hole through said green sheet and said non-conductive paste, such that at least a portion of said non-conductive paste remains adhered to at least a portion of the side-wall of said at least one opening in said support sheet, and at least a portion of said non-conductive paste remains adhered to at least a portion of said green sheet, and
   (e) filling said through-hole with at least one conductive paste.

2. The method of claim 1, wherein said conductive paste comprises a material selected from a group consisting of copper, molybdenum, nickel, tungsten, metal with glass frit and metal with glass grit.

3. The method of claim 1, further comprising, after step (a), the step of coating at least a portion of said support sheet and the side-wall of said opening in said support sheet with at least one material.

4. The method of claim 3, wherein said material is selected from a group consisting of metal oxide and polymer.

5. The method of claim 1, wherein said support sheet is selected from a group consisting of stainless steel, nickel, aluminum, molybdenum, permalloy (alloy of Ni and Mo), polymer, plastic, polyester, PEN (Polyethylene Naphthalate), paper, coated or uncoated paper, wax paper, silicone or acrylic coated paper and ceramic.

6. The method of claim 1, wherein said non-conductive paste comprises a material selected from a group consisting of polymer and ceramic.

7. The method of claim 1, wherein said at least one green sheet comprises a material selected from a group consisting of alumina, alumina with glass frit, borosilicate glass, aluminum nitride and glass ceramic.

8. The method of claim 1, wherein said green sheet has a thickness of between about 0.5 mils and about 6.0 mils.

9. The method of claim 1, wherein said green sheet has a thickness of at least 6 mils.

10. The method of claim 1, further comprising, after step (c), the step of tacking and bonding said green sheet to said support sheet, wherein said tacking and bonding is done using means selected from a group consisting of thermal means, mechanical means and chemical means.

11. The method of claim 10, wherein said tacking and bonding is done at a temperature of less than about 90° C.

12. The method of claim 10, wherein said tacking and bonding is done at a pressure of less than about 800 psi.

13. The method of claim 10, wherein said tacking and bonding is done in a chemical environment, and wherein said chemical is selected from a group consisting of water, methanol, methyl-iso-butyl ketone, isopropyl alcohol, alumina, aluminum nitride, borosilicate, glass ceramic, copper, molybdenum, tungsten and nickel.

14. The method of claim 1, wherein said green sheet includes at least one electrically conductive feature selected from a group consisting of cap, line and via.

15. The method of claim 1, further comprising, after step (e), the step of removing said support sheet from said green sheet.

16. A method for fabricating a ceramic substrate comprising the steps of:
   forming at least one first opening in a first support sheet and at least one second opening in a second support sheet, using a photolithography technique,
   filling said first and second openings with at least one non-conductive paste,
   placing at least one first green sheet on said first support sheet and at least one second green sheet on said second support sheet, wherein at least a portion of said non-conductive paste in said first support sheet is anchored to at least a portion of said first green sheet, and at least a portion of said non-conductive paste in said second support sheet is anchored to at least a portion of said second green sheet,
   opening at least one first through-hole through said first green sheet and said non-conductive paste and at least one second through-hole through said second green sheet and said non-conductive paste, such that at least a portion of said non-conductive paste remains adhered to at least a portion of the side-wall of said first and second openings, and at least a portion of said non-conductive paste remains adhered to at least a portion of said first and second green sheets,
   filling said first and second through-holes with at least one conductive paste, and
   joining said first green sheet to said second green sheet.

17. The method of claim 16, wherein said conductive paste comprises a material selected from a group consisting of copper, molybdenum, nickel, tungsten, metal with glass frit and metal with glass grit.

18. The method of claim 16, further comprising the step of coating at least a portion of said first support sheet and the side-wall of said opening in said first support sheet, and at least a portion of said second support sheet and the side-wall of said opening in said second support sheet, with at least one material.

19. The method of claim 18, wherein said material is selected from a group consisting of metal oxide and polymer.

20. The method of claim 16, wherein at least one of said first support sheet and said second support sheet is selected from a group consisting of stainless steel, nickel, aluminum, molybdenum, permalloy (alloy of Ni and Mo), polymer, plastic, polyester, PEN (Polyethylene Naphthalate), paper, coated or uncoated paper, wax paper, silicone or acrylic coated paper and ceramic.

21. The method of claim 16, wherein said non-conductive paste comprises a material selected from a group consisting of polymer and ceramic.

22. The method of claim 16, wherein at least one of said first green sheet and said second green sheet comprises a material selected from a group consisting of alumina, alumina with glass frit, borosilicate glass, aluminum nitride and glass ceramic.

23. The method of claim 16, wherein at least one of said first green sheet and said second green sheet has a thickness of between about 0.5 mils and about 6.0 mils.

24. The method of claim 16, wherein at least one of said first green sheet and said second green sheet has a thickness of at least 6 mils.

25. The method of claim 16, further comprising the step of tacking and bonding said first green sheet to said first support sheet and said second green sheet to said second support sheet, wherein said tacking and bonding is done using means selected from a group consisting of thermal means, mechanical means and chemical means.

26. The method of claim 25, wherein said tacking and bonding is done at a temperature of less than about 90° C.

27. The method of claim 25, wherein said tacking and bonding is done at a pressure of less than about 800 psi.

28. The method of claim 25, wherein said tacking and bonding is done in a chemical environment, and wherein said chemical is selected from a group consisting of water, methanol, methyl-iso-butyl ketone, isopropyl alcohol, alumina, aluminum nitride, borosilicate, glass ceramic, copper, molybdenun, tungsten and nickel.

29. The method of claim 16, wherein at least one of said first green sheet and said second green sheet includes at least one electrically conductive feature selected from a group consisting of cap, line and via.

30. The method of claim 16, further comprising, after the step of joining said first green sheet to said second green sheet, the step of removing said first support sheet from said first green sheet and said second support sheet from said second green sheet.

31. The method of claim 16, wherein said first green sheet is joined to said second green using a lamination process.

32. The method of claim 31, wherein said lamination is done using a pressure of less than about 800 psi.

33. The method of claim 31, wherein said lamination is done using a temperature of less than about 90° C.

* * * * *